US010387975B2

(12) United States Patent
Rai et al.

(10) Patent No.: US 10,387,975 B2
(45) Date of Patent: Aug. 20, 2019

(54) VIABLE SYSTEM OF GOVERNANCE FOR SERVICE PROVISIONING ENGAGEMENTS

(71) Applicant: TATA Consultancy Services Limited, Mumbai (IN)

(72) Inventors: Veerendra Kumar Rai, Pune (IN); Sanjit Mehta, Pune (IN)

(73) Assignee: TATA Consultancy Services Limited, Mumbai (IN)

( * ) Notice: Subject to any disclaimer, the term of this patent is extended or adjusted under 35 U.S.C. 154(b) by 756 days.

(21) Appl. No.: 14/282,618

(22) Filed: May 20, 2014

(65) Prior Publication Data

US 2014/0343916 A1 Nov. 20, 2014

(30) Foreign Application Priority Data

May 20, 2013 (IN) .......................... 1789/MUM/2013

(51) Int. Cl.
*G06Q 50/10* (2012.01)
*G06Q 10/06* (2012.01)
*G06F 17/50* (2006.01)

(52) U.S. Cl.
CPC ............. *G06Q 50/10* (2013.01); *G06Q 10/06* (2013.01); *G06F 17/5009* (2013.01)

(58) Field of Classification Search
CPC ..... G06F 17/5009; G06Q 10/06; G06Q 50/10
USPC ......................................................... 703/13
See application file for complete search history.

(56) References Cited

U.S. PATENT DOCUMENTS

| 6,564,056 | B1 * | 5/2003 | Fitzgerald | ........... H04L 12/2803 340/5.1 |
| 6,615,166 | B1 * | 9/2003 | Guheen | .................. G06Q 10/06 703/27 |
| 7,177,859 | B2 * | 2/2007 | Pather | ...................... G06F 9/542 |
| 7,512,451 | B2 * | 3/2009 | Detzler | .................. G06Q 10/10 700/29 |

(Continued)

OTHER PUBLICATIONS

Hien, Tran ("Measuring IT service performance—A balanced scorecard approach", Laurea University of Applied Sciences, 2013, pp. 1-72).*

(Continued)

*Primary Examiner* — Kamini S Shah
*Assistant Examiner* — Iftekhar A Khan
(74) *Attorney, Agent, or Firm* — Schwegman Lundberg & Woessner, P.A.

(57) ABSTRACT

Systems and methods for governing execution of a service provisioning engagement are described. In one implementation, the described methods are implemented in the systems, where the method includes determining a customized schema based on a viable systems model, where the customized schema is defined using a plurality of dimensions and a plurality of sub-dimensions, where the plurality of dimensions and the plurality of sub-dimensions is defined using a plurality of parameters. The method also includes determining a system dynamics model which defines relationship between the plurality of parameters of the customized schema. The method further includes setting targets for at least one parameter from amongst the plurality of parameters of the customized schema and simulating the at least one parameter interactively based on the system dynamics model.

16 Claims, 12 Drawing Sheets

(56) References Cited

U.S. PATENT DOCUMENTS

| | | | | |
|---|---|---|---|---|
| 8,078,489 B1* | 12/2011 | Marsten | G06Q 10/04 | 705/7.25 |
| 8,078,524 B2* | 12/2011 | Crawford | G06Q 20/10 | 705/35 |
| 8,214,238 B1* | 7/2012 | Fairfield | G06Q 10/063 | 705/7.11 |
| 8,655,756 B2* | 2/2014 | Seubert | G06Q 20/102 | 705/35 |
| 8,738,484 B2* | 5/2014 | Adcock | G06Q 30/06 | 705/35 |
| 8,799,044 B2* | 8/2014 | Sudarshan | G06Q 10/067 | 705/7.14 |
| 8,924,269 B2* | 12/2014 | Seubert | G06Q 10/06 | 705/35 |
| 9,508,092 B1* | 11/2016 | DeSoto | G06Q 30/00 | |
| 10,095,990 B2* | 10/2018 | Farooq | G06Q 30/0201 | |
| 2002/0169658 A1* | 11/2002 | Adler | G06Q 10/06 | 705/7.28 |
| 2003/0172002 A1* | 9/2003 | Spira | G06Q 10/10 | 705/26.1 |
| 2004/0068431 A1* | 4/2004 | Smith | G06Q 10/063112 | 705/7.14 |
| 2004/0122962 A1* | 6/2004 | DiFalco | H04L 29/06 | 709/229 |
| 2004/0230463 A1* | 11/2004 | Boivin | G06Q 10/06 | 705/7.36 |
| 2006/0031813 A1* | 2/2006 | Bishop | G06F 9/5061 | 717/102 |
| 2006/0129447 A1* | 6/2006 | Dockery | G06Q 10/06 | 705/7.13 |
| 2006/0184416 A1* | 8/2006 | Nag | G06Q 10/06375 | 705/7.37 |
| 2006/0190605 A1* | 8/2006 | Franz | G06Q 10/0631 | 709/226 |
| 2006/0247959 A1* | 11/2006 | Oden | G06Q 10/063 | 705/7.14 |
| 2008/0294996 A1* | 11/2008 | Hunt | G06Q 30/02 | 715/739 |
| 2008/0300844 A1* | 12/2008 | Bagchi | G06Q 10/06 | 703/13 |
| 2009/0113427 A1* | 4/2009 | Brady | G06Q 10/06 | 718/100 |
| 2009/0132708 A1* | 5/2009 | Hayward | G06F 9/5055 | 709/226 |
| 2009/0193057 A1* | 7/2009 | Maes | H04L 67/306 | |
| 2010/0064033 A1* | 3/2010 | Travostino | H04L 67/20 | 709/220 |
| 2010/0070291 A1* | 3/2010 | Handy | G06Q 10/06 | 705/1.1 |
| 2010/0070348 A1* | 3/2010 | Nag | G06Q 10/06393 | 705/7.39 |
| 2010/0274982 A1* | 10/2010 | Mehr | G06F 11/1458 | 711/162 |
| 2010/0280863 A1* | 11/2010 | Wilcock | G06Q 10/00 | 705/7.11 |
| 2011/0004565 A1* | 1/2011 | Stephenson | G06Q 10/06 | 705/348 |
| 2011/0112876 A1* | 5/2011 | Khare | G06Q 10/063 | 705/7.11 |
| 2011/0264592 A1* | 10/2011 | Graupner | G06Q 10/06 | 705/301 |
| 2011/0277027 A1* | 11/2011 | Hayton | H04L 63/0815 | 726/8 |
| 2012/0053981 A1* | 3/2012 | Lipps | G06Q 10/0635 | 705/7.28 |
| 2012/0259671 A1* | 10/2012 | Oden | G06Q 10/063 | 705/7.17 |
| 2012/0323628 A1* | 12/2012 | Jaster | G06Q 30/02 | 705/7.29 |
| 2013/0085960 A1* | 4/2013 | Lokku | G06Q 10/00 | 705/348 |
| 2013/0179215 A1* | 7/2013 | Foster | G06Q 10/00 | 705/7.28 |
| 2013/0325608 A1* | 12/2013 | Kulkarni | G06Q 30/0255 | 705/14.53 |
| 2013/0325681 A1* | 12/2013 | Somashekar | G06Q 40/00 | 705/35 |
| 2013/0339099 A1* | 12/2013 | Aidroos | G06Q 50/01 | 705/7.36 |
| 2014/0181255 A1* | 6/2014 | Thomas | G06F 9/5072 | 709/217 |
| 2014/0257901 A1* | 9/2014 | Murthy | G06Q 10/06313 | 705/7.17 |
| 2014/0279201 A1* | 9/2014 | Iyoob | G06Q 30/0631 | 705/26.7 |
| 2015/0142949 A1* | 5/2015 | Nair | H04L 67/10 | 709/224 |
| 2015/0156065 A1* | 6/2015 | Grandhe | H04L 41/5054 | 709/224 |
| 2016/0065417 A1* | 3/2016 | Sapuram | G06Q 30/0631 | 709/223 |

OTHER PUBLICATIONS

Core ("Service Level Agreements Contract and Performance Management", CORE: Nov. 2011, pp. 1-42).*

2GC ("Service Level Agreements & the Balanced Scorecard", 2GC Active Management, 2013, pp. 1-25).*

Kern et al. ("Application Service Provision: Risk Assessment and Mitigation", University of Minnesota, 2002, pp. 113-126) (Year: 2002).*

Tran Hien ("Measuring IT service performance—A balanced scorecard approach", Business Administration Bachelor's Thesis December, Laurea University of Applied Sciences, 2013, pp. 1-72) (Year: 2013).*

* cited by examiner

| Dimension | system 1- service delivery | | |
|---|---|---|---|
| Sub-dimension | Service delivery execution | Service delivery process metrics | Costs |
| Parameters | Number of vendor senior associates | Quality of service | Resource costs |
| | Number of vendor junior associates | Project completion time | Information exchange overheads |
| | On-site Off-site ratio | Resource productivity | |
| | Vendor leverage | Cycle time per work order | |
| | Work queued | | |
| | Work completed with errors | | |
| | Work completed without errors | | |
| | Clarity in definition of roles and responsibilities | | |
| | Schedule pressure | | |
| | Process maturity | | |
| | Utility of knowledge assets created | | |
| Sub-dimension | Service delivery resource competencies | Change management | |
| Parameters | Functional knowledge competency | Understanding of client requirements | |
| | Domain knowledge competency | Number of change requests raised | |
| | Functional knowledge discrepancy | Work due to change requests | |
| | Domain knowledge discrepancy | | |

Fig. 3(a)

| Dimension | System 2- Communication and co-ordination | | |
|---|---|---|---|
| Sub-Dimensions | Overheads | Communication interface | Competency and knowledge management |
| Parameters | Communication overheads | Communication interface maturity | Number of subject matter experts |
| | Co-ordination overheads | Communication Interface between Development and Testing Teams | Number of knowledge management experts |
| | | Impact of interface on quality of work | Resource productivity |
| | | Frequency of stakeholder meetings | Skill development and training |
| | | Required level of collaboration for the project | Resource training time |
| | | Communication of requirements and issues | Knowledge assets created |
| | | | Costs of training |
| | | | Costs of knowledge management |

Fig. 3(b)

| Dimension | System 3 - Monitor and control | | |
|---|---|---|---|
| Sub-Dimensions | Performance management | Resource management | Costs |
| Parameters | Discrepancy in quality of service | Resource deficit | Monitoring costs |
| | Schedule over-run | Senior associates hired | Resource hiring costs |
| | Reduction in cycle time | Junior associates hired | Process improvement costs |
| | Resource productivity | Percentage of resources on bench | Resource costs |
| | Definition of PMO interface | Resources rolled-off project | |
| | Definition of performance measurement metrics | Senior to junior employees ratio | |
| | Project performance tracking | Resource utilization | |
| | Project performance | Delay in perceiving work volume | |

Fig. 3(c)

| Dimension | System 4 - Planning and intelligence |
|---|---|
| Sub-Dimensions | *Visibility into external environment* |
| Parameters | Fluctuations in client requirements |
| | Fluctuations in business requirements |
| | Visibility to client's business environment |
| | Projection of client's requirements |
| | Visibility into work pipeline |

| Dimension | System 5 - Policy decisions |
|---|---|
| Parameters | Cost benefits |
| | Contract completeness |
| | Purpose and goals |
| | Performance measurement criteria |
| | Definition of service level agreement |

Fig. 3(d)

| Scorecard | Target | Simulation values | Target deviation |
|---|---|---|---|
| Scheduled project completion time | 300 | 449 | 149 |
| Quality of service | 0.95 | 0.9 | 0.05 |
| Percentage schedule over-run | 0 | 50 | 50 |
| Percentage work due to change requests | 5 | 0.8 | 4.2 |
| Financials | Target | | |
| Percentage cost benefits through offshoring | 50 | 40 | 10 |
| Percentage automation costs | 5 | 0 | 5 |
| Percentage overhead costs | 5 | 4.2 | 0.8 |
| Percentage training costs | 5 | 3 | 2 |
| Percentage of knowledge management costs | 5 | 2 | 3 |
| Internal Processes | Target | | |
| Reduction in effort per work order due to automation | 40 | 0 | 40 |
| Productivity improvement due to knowledge management | 30 | 23 | 7 |
| Resource utilization | 100 | 107 | 7 |
| Delay in perceiving work volume | 6 | 6 | 0 |
| Reduction in training time | 40 | 35 | 5 |
| Learning and Growth | Target | | |
| Discrepancy in functional knowledge competency | 10 | 60 | 50 |
| Discrepancy in technical knowledge competency | 10 | 65 | 55 |
| Reusability of knowledge repository | 50 | 30 | 20 |
| Improvement in functional knowledge competency | 0.4 | 0.02 | 0.38 |
| Improvement in domain knowledge competency | 0.4 | 0 | 0.4 |

| Customer | Target |
|---|---|
| Scheduled project completion time | 300 |
| Quality of service | 0.95 |
| Percentage schedule over-run | 0 |
| Percentage work due to change requests | 5 |
| Financials | Target |
| Percentage cost benefits through offshoring | 50 |
| Percentage automation costs | 5 |
| Percentage overhead costs | 5 |
| Percentage training costs | 5 |
| Percentage of knowledge management costs | 5 |
| Internal processes | Target |
| Reduction in effort per work order due to automation | 40 |
| Productivity improvement due to knowledge management | 30 |
| Resource utilization | 100 |
| Delay in perceiving work volume | 6 |
| Reduction in training time | 40 |
| Learning and growth | Target |
| Discrepancy in functional knowledge competecy | 10 |
| Discrepancy in technical knowledge competecy | 10 |
| Re-usability of knowledge repository | 50 |
| Improvement in functional knowledge competency | 0.4 |
| Improvement in domain knowledge competency | 0.4 |

Fig. 6

VIABLE SYSTEM OF GOVERNANCE FOR SERVICE PROVISIONING ENGAGEMENTS

CLAIM OF PRIORITY

This application claims the benefit of priority of Indian Patent Application Serial Number 1789/MUM/2013, filed on May 20, 2013, the benefit of priority of which is claimed hereby, and which is incorporated by reference herein in its entirety

TECHNICAL FIELD

The present subject matter relates, in general, to service provisioning engagements and, particularly but not exclusively, to governance of the service provisioning engagements.

BACKGROUND

Service provisioning engagement refers to delivery of services from a service provider to a client of the service provider, according to an agreement between the service provider and the client. The services delivered by the service provider to the client may include information technology (IT) based services. Scope of the service provisioning engagement, deliverables expected during the service provisioning engagement, and a criterion for acceptance of service provisioning engagement is agreed upon between the client and the service provider. The service provisioning engagement defines the governance, monitoring, and pricing policy. The service provider generally has experience in handling similar type of services and is capable of providing the services to the client in the most optimum manner, and therefore, the client may choose to enter into a service provisioning engagement in some select functions with the service provider rather than performing the services.

Service provisioning engagements can be either done in-house, that is, it can be undertaken by a specific department in the client's organization, or service provisioning can be outsourced, in which case another external organization provides services to the client. Outsourced service provisioning is generally governed by contracts, whereas, in case of an in-house service provisioning, the clauses may be inherently understood or may be discussed orally or may be governed by contracts.

Service provisioning engagements are preferred because of the various advantages provided by service provisioning which includes lower costs, experience in performing the service, focused approach to work delivery. Service provisioning models have evolved over a period of time and models the terms of engagement between service provider and client. A service provisioning engagement may involve the service provider providing resources to the client for specific time duration. A service provisioning engagement may also involve executing a project from inception to delivery by the service provider.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 3 (a), FIG. 3(b), FIG. 3(c), and FIG. 3(d) depict dimensions of the viable systems model schema, in accordance with an embodiment of the present subject matter.

FIG. 5(a), FIG. 5 (b), and FIG. 5(c) illustrates the results of simulation run-1, simulation run-2, and simulation run-3 respectively, in accordance with an embodiment of the present subject matter.

FIG. 6 illustrates a perspective view of a balanced score card view, in accordance with an embodiment of the present subject matter.

Figure 1:
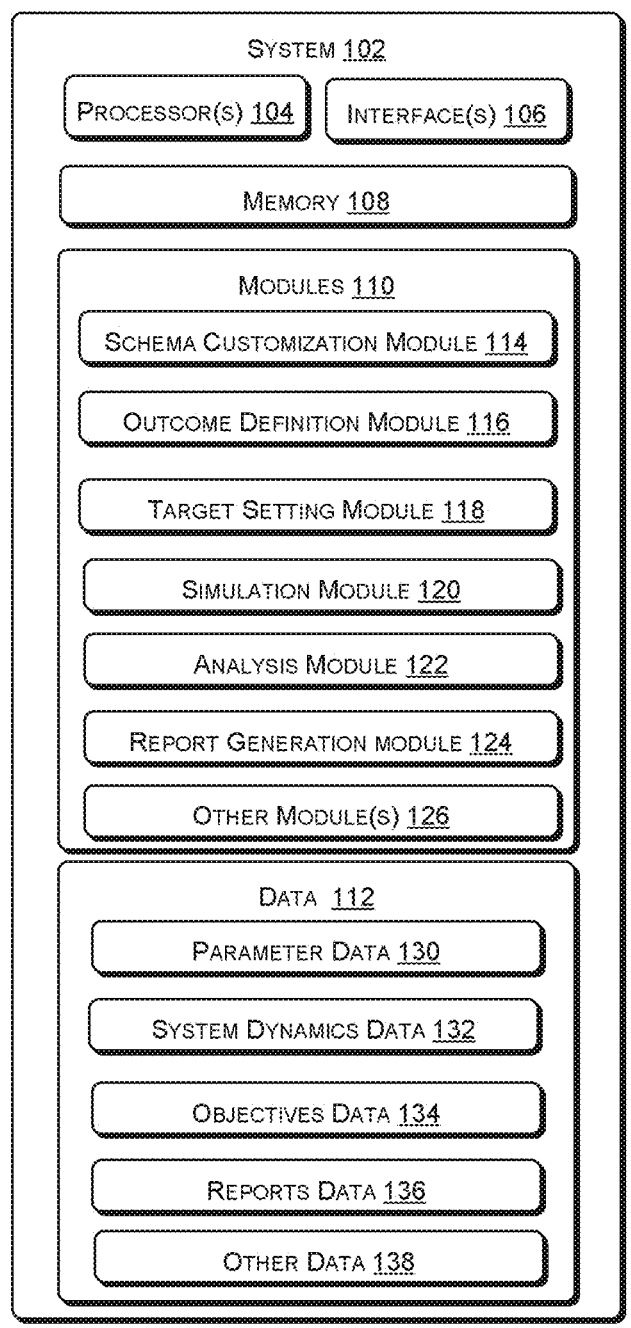
FIG. 1 illustrates an exemplary system implementation of a governance system, in accordance with an embodiment of the present subject matter.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

DETAILED DESCRIPTION

Systems and method for governing execution of service provisioning engagements are described. Governing execution of service provisioning engagement may include defining a schema with parameters, setting targets for parameters, and simulating values based on some predefined relationships between parameters. The methods can be implemented in various computing devices communicating through various networks.

During a lifecycle of an engagement between a client and a service provider, the engagement may undergo changes and transformations in order to meet the expectations of the client as well as the service provider. For example, an engagement between the client and the service provider may have commenced based on a staff augmentation service provisioning model, that is, a model where the service provider is responsible only for augmenting the client's project with staff. During the course of the engagement, the client may wish that the service provider to provide services under managed services provisioning model. Managed services outsourcing model may include management of engagement including people responsibilities and deliverables of the engagement. Therefore, during the lifecycle of one engagement, more than one service provisioning models may be used to govern the engagement, which may require the evolution of governance structure.

According to conventional systems, the monitoring framework provides for monitoring of adherence or deviation of the execution of the engagement from the objectives of the engagement. The monitoring framework of an engagement allows monitoring of execution of the engagement adapted to one service provisioning model. Conventionally, the monitoring frameworks does not provide for governing of the engagement across different provisioning models. Conventionally, the monitoring framework does not cater to transition from one service provisioning model to another. The monitoring framework has to adapt a new for each service provisioning model.

Conventionally, the monitoring framework of an engagement does not identify transformational opportunities. Monitoring different aspects of an engagement may assist in identifying opportunities for transformation or evolution of the service provisioning model of the engagement. Conventional systems do not provide for identifying aspects that assist in identifying these transformational opportunities.

Further, in the conventional systems, the monitoring framework may monitor goals that have been identified for each engagement. However, according to conventional systems, the possibility of assessing the feasibility of achieving a goal is not provided. Therefore, there may be a possibility of setting of unachievable or unrealistic targets, which may also have a negative implication of the assessment of execution of the engagement. Further, the governance framework may not be able to identify the relationships between different parameters. For example, the service provisioning model may have two parameters identified, namely, total cost of employees in project, and onsite to offshore ratio of employees. However, the governance framework may not identify that a lower onsite to offshore ratio may also imply lower total cost of employees in project.

According to an implementation of the present subject matter, systems and method for governing execution of engagements are described. The systems and the methods may include definition of the engagement using parameters in the form of a schema. Further, the present subject matter may also assess the engagement by simulating outcomes based on underlying knowledge of impact of multiple parameters on each other. The systems and the methods for governing execution of engagements may also include alteration of parameters or targets or both to achieve the most optimal performance for the engagement. Examples of the engagements may include software project management, business process service management, and transportation service management. The systems and the methods of the present subject matter can be implemented in various computing devices communicating through various networks. Although the description herein is with reference to computing systems used in a communication network, the methods and the systems may be implemented in other systems capable of assessing outsourcing engagements, albeit with a few variations, as will be understood by a person skilled in the art.

The systems and the methods according to the present subject matter enable the use of a predefined viable schema to be associated with an engagement. The viable system model based schema has been defined using governance requirements, across various projects in the area of service provisioning engagements. The viable system model based schema includes different aspects of a service provisioning engagement, which are most likely to be used for assessment of execution of a given engagement. The systems and the methods according to the present subject matter allows for customization of the schema based on viable systems model. The schema may be altered to suit the specific requirement of the client.

According to the present subject matter, a viable system model based schema is defined as a hierarchy of parameters. Each parameter or a group of parameters may represent a particular dimension of the engagement, such as service delivery.

A system dynamics model may also be associated to the defined schema based on the viable system model, where the system dynamics model defines relationships between different parameters of the defined schema. The system dynamics model may define rules of relationships among the plurality of parameters. Thereafter, one or more of the parameters from among the plurality of parameters may be initialized with values suitable for the engagement. In an example, user defined targets, referred to as benchmark values, and may be set for various parameters in the viable system model of the engagement. Further, the governance system may simulate values, also referred to as simulated values, based on the values of parameters initialized in the schema, and the system dynamics models. Subsequently, the engagement may be assessed, whether the simulated values meet the benchmark values or not.

According to the present subject matter, any deviation in the simulated value from the benchmark value may be analyzed by the governance system to identify one or more causes for the deviation. Also the deviation may be analyzed to consider a strategic change in the engagement, where the strategic change may be with respect to altering the benchmark.

For example, if a target has been set for delivery of a project with complexity of 'n' to be 9 months. The governance system may define a benchmark value for the period for delivery of project of similar complexity to be 3 months. The governance system in this case may enable a user to do a causal analysis of the deviation. If the causal analysis leads to the parameter of 'employee experience' leading to a deviated target, then the governance system may alter the service provisioning model with relation to the 'employee experience'.

In case of evolution of an engagement from one service provisioning model to another, the governance structure can be dynamically updated to capture aspects of the engagement, which is based on the evolved service provisioning model. Furthermore, the governance system may be used to govern the execution of the engagement throughout the lifecycle of the engagement.

It should be noted that the description merely illustrates the principles of the present subject matter. It will thus be appreciated that those skilled in the art will be able to devise various arrangements that, although not explicitly described herein, embody the principles of the present subject matter and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Figure 2:
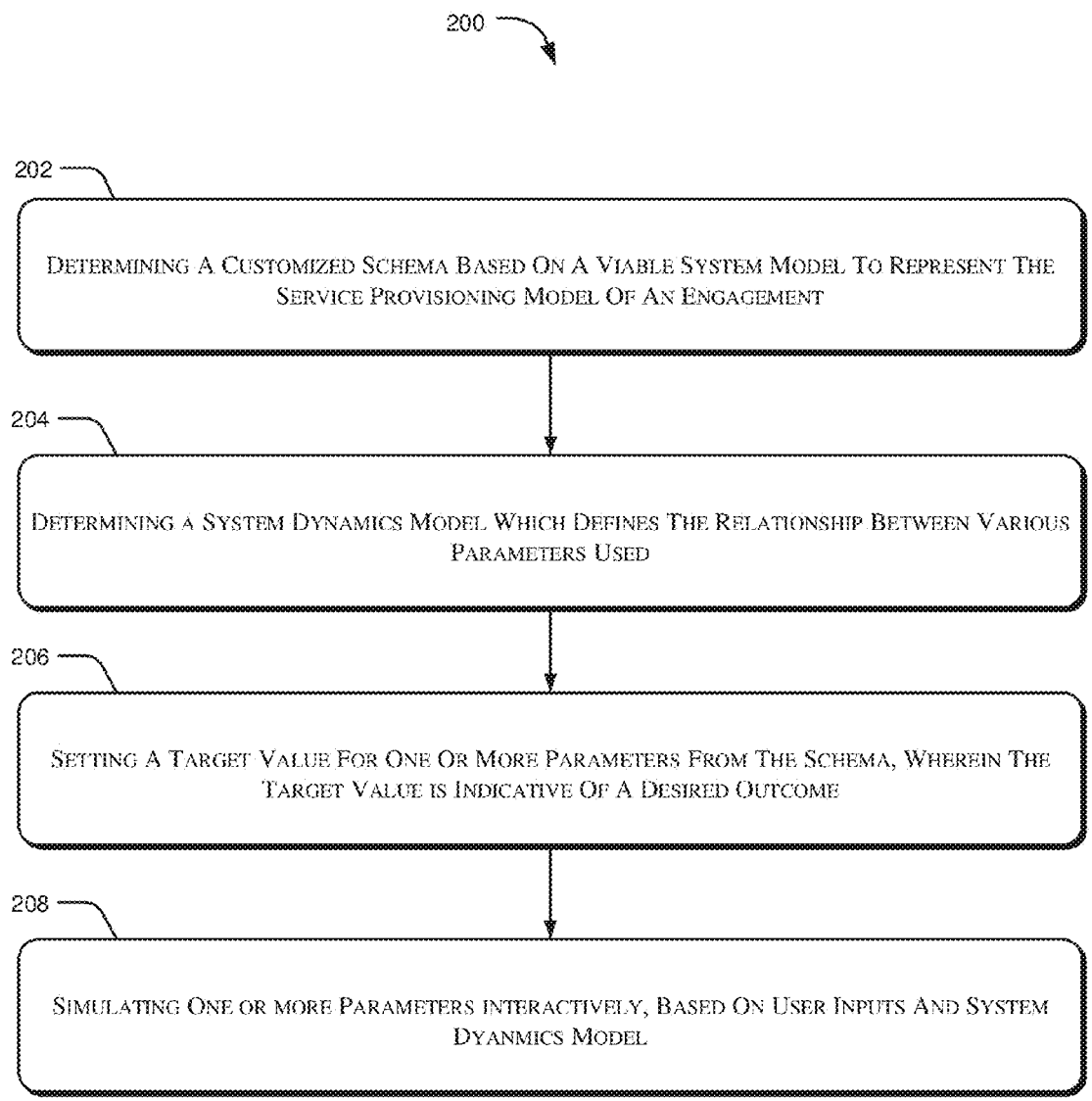
FIG. 2 illustrates an exemplary method for assessing execution of service provisioning engagements, in accordance with an embodiment of the present subject matter.

The manner in which the systems and the methods of governing an engagement through its lifecycle shall be implemented has been explained in details with respect to the FIGS. 1 and 2. While aspects of described systems and methods for governing an engagement through its lifecycle be implemented in any number of different computing systems, transmission environments, and/or configurations, the embodiments are described in the context of the following exemplary system(s).

FIG. 1 illustrates a schematic implementation of a governance system 102, herein after referred to as a system 102, in accordance with an embodiment of the present subject matter. The system 102 described herein, can be implemented in any network environment comprising a variety of network devices, including routers, bridges, servers, computing devices, storage devices, etc. In one implementation the system 102 can connected to one or more client devices (not shown), through a communication network (not shown). Such client device may provide information or view analysis data and reports about the details of the service provisioning engagements and associated parameters. Further, these client devices may also be located at vendor's end and client's end.

The governance system 102 can be implemented as a variety of servers and communication devices. The servers and computing systems that can implement the described method(s) include, but are not limited to, mail server, central directory servers, database server, file server, print server, web server, application server, and the like. The system 102 may also be implemented as a computing device, such as a laptop computer, a desktop computer, a notebook, a workstation, a mainframe computer, a server, and the like. The system 102 described herein, can also be implemented in any network environment comprising a variety of network devices, including routers, bridges, servers, computing devices, storage devices, etc.

In one implementation, the system 102 includes processor(s) 104. The processor 104 may be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory.

The functions of the various elements shown in the figure, including any functional blocks labeled as "processor(s)", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), non-volatile storage. Other hardware, conventional and/or custom, may also be included.

Also, the system 102 includes interface(s) 106. The interfaces 106 may include a variety of software and hardware interfaces that allow the system 102 to interact with modules in another system, or modules to interact with each other, or interfaces 106 may be used to receive data from a user and display corresponding reports.

In another embodiment of the present subject matter, the system 102 may also include a memory 108. The memory 108 may be coupled to the processor 104. The memory 108 can include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

Further, the system 102 may include module(s) 110 and data 112. The modules 110 and data 112 may be coupled to the processors 104. The modules 108, amongst other things, include routines, programs, objects, components, data structures, etc., which perform particular tasks or implement particular abstract data types. The modules 110 may also be implemented as, signal processor(s), state machine(s), logic circuitries, and/or any other device or component that manipulate signals based on operational instructions.

Further, the modules 110 can be implemented in hardware, instructions executed by a processing unit, or by a combination thereof. The processing unit can comprise a computer, a processor, a state machine, a logic array or any other suitable devices capable of processing instructions. The processing unit can be a general-purpose processor which executes instructions to cause the general-purpose processor to perform the required tasks or, the processing unit can be dedicated to perform the required functions.

In another aspect of the present subject matter, the modules 110 may be machine-readable instructions (software) which, when executed by a processor/processing unit, perform any of the described functionalities. The machine-readable instructions may be stored on an electronic memory device, hard disk, optical disk or other machine-readable storage medium or non-transitory medium. In one implementation, the machine-readable instructions can be also be downloaded to the storage medium via a network connection.

In an implementation, the module(s) 110 includes a schema customization module 114, an outcome definition module 116, target setting module 118, simulation module 120, analysis module 122, report generation module 124 and other modules 126. The other module(s) 126 may include programs or coded instructions that supplement applications or functions performed by the system 102. In said implementation, the data 112 includes parameter data 130, system dynamics data 132, objectives Data 134, reports data 136, and other data 138. The other data 138, amongst other things, may serve as a repository for storing data that is processed, received, or generated as a result of the execution of one or more modules in the module(s) 110. Although the data 112 is shown internal to the system 102, it may be understood that the data 112 can reside in an external repository (not shown in the figure), which may be coupled to the system 102. The system 102 may communicate with the external repository through the interface(s) 106 to obtain information from the data 112.

The system 102 is configured to govern execution of engagements based on objectives, critical success factors, control variables and other parameters and interdependencies between parameters. The system 102 can adapt to multiple service provisioning models during the lifecycle of the engagement. The system 102 allows for proactive and dynamic interactive governance of the goals of the engagement by simulating possible outcomes in the form of simulated values. The simulation allows for identifying areas of concern, revising expectations of an engagement and taking corrective action where the simulated values are deviated from the benchmark values. The system 102 may also identify opportunities for improvement based on analysis of the results of the simulation.

In accordance to the present subject matter, the schema customization module 114 is adapted to customize a schema for governing the execution an engagement, where the engagement is modeled based on a particular service provisioning model. A schema may be understood as a hierarchy of dimensions, sub-dimensions and parameters that can be used to represent an engagement. The schema allows for effective governance of various dimensions of an engagement.

In one implementation, the schema customization module 114 provides a viable systems based schema as a basis for governance of engagement and evolution thereof. The viable systems model is a generic schema that defines certain parameters and systems that may be used for the governance of an engagement. Therefore, a schema based on the viable systems model may be adopted to provide a governance structure of an engagement. Further the viable systems model based schema may continue to be used for the engagement when the engagement evolves from one service provisioning model to another service provisioning model. In one implementation, the predefined schemas based on viable systems model may be available in a repository of schemas and may be chosen by a domain administrator, where the schemas may appropriately and sufficiently capture the dimensions of a particular service provisioning model. An appropriate schema may be chosen by the domain administrator from the repository and may be further customized to suit the requirements of the engagement.

The viable systems model based schema encapsulates the following systems—'operations', 'co-ordination and regulation', 'monitor and control', 'Intelligence and planning' and 'Policy decisions'. Each of these five functions may contain all the five functions recursively. So 'operations' may contain all functions and so can other remaining functions.

The domain administrator or user may customize the viable systems model based schema to suit the engagement. The customized schema based on viable systems model may be adapted to various outsourcing engagements and service provisioning models during the lifecycle of an engagement. Therefore, the system 102 may be adapted and used for governance of the execution of the engagement during the complete lifecycle of the engagement.

For example, an engagement may be initiated between a client and service provider using a staff augmentation service provisioning model. According to the service provisioning model, the service provider may be expected to provide a pre-determined number of trained staff for a period of one year. At the end of one year, the client and service provider may agree to adopt managed services as the service provisioning model. According to this model, the service provider agrees management of the project with timely deliverables. In the given example, the system 102 may be adopted to govern the execution of the engagement adapted to the staff augmentation model. Further, even after the "managed services" model is adopted for the engagement, the schema customization module 114 enables the system 102 to be adapted to govern the engagement adapted to the service provisioning model used for the engagement.

The viable systems model based schema is shown in FIG. 3(a), FIG. 3(b), FIG. 3(c), and FIG. 3(d) below for a clearer understanding of all the dimensions involved. The FIG. 3(a), FIG. 3(b), FIG. 3(c), and FIG. 3(d) is a representation of the dimensions, sub-dimensions of each dimension, and parameters of each sub-dimension that together form viable systems model schema according to a particular implementation of the present subject matter.

It may be appreciated by a person skilled in the art that the governance structure based on viable systems model will evolve as the engagement evolves from one service provisioning model to another. In another implementation, a model that sufficiently captures the essential dimensions of an engagement may be used in place of the viable system model.

In one implementation of the present subject matter, the schema customization module 114 may be further adapted to define a systems dynamics model. The system dynamics model may be understood as a rule based model to determine the relationship between parameters associated with the engagement. The associated system dynamics model may include rules with regard to the dynamics of the parameters and the interdependencies of parameters. Dynamics of the parameter refers to the behavior of a parameter in a particular environment, the impact of a given parameter on the other parameters in the environment, and the influence of other parameters on the particular parameter. In other words, the systems dynamic model may define the rules of assessment of any given parameter.

The dynamics of the engagement may be understood to be based on the system dynamics model. The system dynamics model is chosen to capture all the necessary parameters intended to define a relationship and also the interaction between the parameters. In one implementation, the system dynamics model may be chosen from a repository, where the parameters and rules with regard to relationship of parameters are predefined. The domain administrator or user may further customize the system dynamics model to include specific user defined parameters and the rules relating the user defined parameters, to other parameters in system dynamics model.

In another implementation, the system dynamics model may be defined by the domain administrator or user using existing parameters or user defined parameters. In case of definition of user defined parameters, the rules with regard to the relationship may be identified. In said implementation, the schema customization module 114 may represent system dynamics model as a set of correlated parameters. The parameters may be correlated based on certain dimensions of the system such as cost, or control and communication. The domain administrator may choose one or more sets of correlated parameters.

Further, the schema customization module 114 may determine the system dynamics model based on the parameters in the customized schema. The system dynamics model may identify relationships between all parameters defined in the customized schema. The domain administrator may study the system dynamics model to analyze whether the system dynamics model sufficiently represents the dynamics of the engagement. If the domain administrator determines the system dynamics model to be insufficient, the domain administrator may modify the system dynamics model.

For example, if the engagement uses managed services as the service provisioning model and managed services involves knowledge management as a dimension that has been defined in the schema based on viable system model corresponding to the engagement, then the system dynamics model will include rules for parameters related to knowledge management. The parameters related to knowledge management may include, but not limited to, 'number of employees without relevant experience', 'number of employees with relevant work experience', 'number of trainings on updating in a particular technology', and 'assessment modules'. According to the system dynamics model, the relationship between the different parameters may include a rule, which states that the number of employees without relevant experience may have to undergo a particular set of relevant trainings in the first year of engagement. As earlier described, the rules may be defined based on the service provisioning model used in the engagement. It may also be based on definitions provided by the domain administrator.

The outcome definition module 116 may define objectives, critical success factors and control variables for the engagement. Each engagement may have certain objectives that are expected to be achieved during the course of engagement. Objectives may depend on the service provisioning model of the engagement or objectives may be specific to the instance of the engagement. Objectives may be defined using one or more parameters used in the customized schema used to represent the engagement.

In one implementation, the outcome definition module 116 may provide a list of objectives based on the customized schema. According to the given implementation, the outcome definition module 116 may determine objectives that are based on the dimensions, sub-dimensions and parameters chosen in the schema. In another implementation, the objectives may also be defined by the domain administrator. The objectives can be defined by using parameters. In one implementation, the parameters used for objectives are used in the schema and the relationship between the parameters is defined by the system dynamics model over which the engagement is instantiated. For example, an objective of a particular engagement may be timely delivery of an engagement.

The outcome definition module 116 is also adapted to identify and determine Critical Success Factors (CSFs). The CSFs are a subset of parameters defined in the engagement which may affect achievement of the objectives. In one implementation, CSFs identified are a subset of the objectives. In another implementation, CSFs that are identified encapsulate other dimensions or sub-dimensions of the engagement that are considered as critical to the performance and the successful execution of the engagement.

The CSFs may be defined as a subset of parameters that may be singly or in combination affect the outcome of the engagement. The outcome definition module 116 determines the CSFs based on the service provisioning model, domain in which the engagement functions and marketing and economic information. In another implementation, the CSFs may be user defined where the user may use one or more parameters for defining the CSF. The user defined CSFs may include CSFs as agreed with the client. In the given implementation, the CSFs could be defined in addition to the CSFs determined by the outcome definition module 116. In one implementation, the outcome definition module 116 allows modification of the CSFs that are determined by the outcome definition module 116.

For example, if the objective identified for the engagement is timely delivery, the CSFs identified may be resource efficiency and resource utilization. Examples of CSFs may include, cost related factors, contractual completeness, vendor resource utilization, stakeholder satisfaction, core competence management, etc. Each service provisioning engagement may involve one or more of these CSFs. A person skilled in the art may appreciate that even if the same service provisioning model is used across two different engagements; client requirements, or economic and market dynamics may vary, and correspondingly the CSFs have to be updated to suit the same.

The outcome definition module 116 may also be adapted to identify control variables. The control variables are parameters that may be used to alter the outcome of a particular objective or the CSF or any other parameter. Relationship between control variables and parameters may be defined in the system dynamics model on which the engagement is instantiated.

Each control variable may be identified based on multiple strategies. One strategy may be that a control variable may be identified based on the similarity in terms of the objectives, such as 'resource management', 'operating model modification', 'right sourcing' etc. That is, in case a control variable has already been identified as altering the outcome of one objective, then the control variable may be identified as altering the outcome of a similar objective. The domain administrator or the user may be able to analyze similar objectives. Another approach to identifying control variables may be based on a dimension of the schema that the control variable belongs. That is, in case a control variable has been identified for a parameter, and the identified control variable belongs to the dimension "Monitor and Control", then another parameter belonging to the same dimension or sub-dimension may also be identified as a control variable.

The control variables may be used to alter the outcome of a parameter. The control variables are used when a particular dimension, sub-dimension, objective, or CSF is a cause for concern and corrective measures may have to be taken towards altering the outcome objectives or CSFs. According to an implementation, the target setting module 118 is adapted to set targets for objectives, or CSFs, or other parameters. The targets for objectives, or CSFs, or other parameters are referred to as benchmark values. The benchmark values represent the desirable outcome of the specific parameters in a given engagement. The benchmark values may be set for individual parameters or a combination of parameters. The benchmark values are used to assess whether the engagement is executed as expected. The benchmark values are usually engagement specific. The target setting module 118 may provide guideline targets, or boundary targets. In an implementation, the guideline target or boundary target may be based on an industry standard. That is, the target setting module 118 may provide certain benchmark values that are prescribed as the threshold values or minimum values that have to be achieved. The benchmark values may also be user defined. The benchmark values may also be specified based on specific time timelines. That is, quarterly and half yearly benchmark values may have to be set.

The target setting module 118 also allows the initialization of a subset of parameters. The initialization of parameters may also be engagement specific and user defined or there may be certain parameters for which default values may be provided.

For example, for the objective 'total project execution costs', the target for total project execution cost for first quarter may be $\frac{1}{10}$th of the total engagement execution cost. Similarly half yearly may be up to $\frac{1}{4}$th the total engagement execution cost, by the completion of the 3rd quarter of the engagement, up to $\frac{3}{4}$th the total engagement execution cost may be allowed and by end of engagement, the total engagement execution cost may be spent.

The simulation module 120 simulates possible outcomes of a subset of parameters. The simulation module 120 may use the system dynamics model to arrive at simulated values which represent outcomes. The simulation module 120 simulates interactively by accepting user inputs. The inputs could be altered control variables or redefined benchmark values. The simulation module 120 may further allow simulation re-runs based on user inputs. Further, the simulation module 120 may allow for simulation to be done for a given period of time. For example, if a variable 'quarterly number of junior employee recruits' is a parameter that needs to be simulated, the simulation has to be performed to represent the simulation for a finite period of time. The simulated value may depend on the time period for which the simulation run was executed, the initial values and values of other parameters that affect outcome of parameter quarterly number of junior employees recruited.

The simulation module 120 may use system dynamics model to interpret the impact of other parameters in the system dynamics model, on the parameter intended to be simulated. The simulation module 120 may also use the values initialized for parameters that are utilized in the simulation. For example, if the schema has a parameter 'number of senior employees' initialized as 100, and the rate of recruitment per quarter of senior employees is given at 10% of senior employees, if the recruitment of junior employees is at 35%, then the simulation module 120 considers the rate of recruitment of junior employees. If the rate of recruitment of junior employees has a value of 35%, then the simulation module 120 simulates the number of senior employees as 110. The simulation module 120 may also allow simulation of values of other parameters based on initialized values or based on simulated values.

In one implementation, the simulation module 120 may allow for the results of one or more simulated runs to be viewed alongside with benchmark values of specific parameters. In another implementation, the simulation module 120 may be used to display the deviation of simulated values from the targeted values.

In one implementation, the simulation module 120 is used to simulate objectives for which targets are set using the target setting module 118, as described earlier. The domain administrator or user may assess the feasibility of the targets set, based on the simulation. Since the simulation module 120 uses the system dynamics model, the simulated value arrived at may depend on multiple factors, as given in the system dynamics model.

In another implementation, the analysis module 122 may be adopted to perform causal analysis. The causal analysis is the analysis of a particular parameter which has deviated from the target, to arrive at the cause for the deviation of the parameter from the target. In one implementation, the causal analysis of a target deviated parameter, may indicate one or more control variables. The causal analysis of a parameter is only indicative of potential areas of change, which could result in the alteration of the outcome. The control variables that are identified as a result of causal analysis may be used to alter the simulated values arrived at during simulation. In case of a deviated target, if altering the value of the one or more control variables does not yield the desirable outcome, then the benchmark value may be altered so as to reduce the deviation of the simulated value from the benchmark value.

In another implementation, the causal analysis is performed based on a causal tree which can be traced back to arrive at control variables. In the given implementation, the analysis module 122 may additionally depend on the system dynamics model that is used to instantiate an engagement to determine the impact of control variables on relevant parameters. The analysis module 122 uses the causal tree and system dynamics module to arrive at outcome of one or more parameters that are affected because of alteration of the control variable.

Given a particular objective the outcome definition module 116 displays several parameters which may be considered to alter the outcome of a particular parameter. Upon the user or the domain administrator selection of a particular parameter, the outcome definition module 116 may identify it as a control variable. Alternatively, the outcome definition module 116 may further analyze the parameters that alter the outcome of the parameter that was selected by the domain administrator or user.

In another implementation, a causal tree may be constructed for a particular objective. The causal tree is a representation of all the parameters in a particular hierarchy, where the leaf parameters of a particular root parameter of a causal tree are understood to cause an outcome of the root parameter.

In one implementation, causal trees and control variables may be stored in the repository and may be determined by the outcome definition module 116. In another implementation, control variables may also be user defined, depending on the requirement of the engagement.

For example, in the example given above, availability of automation tools may be a control variable for the CSF, namely, resource efficiency.

Figure 4A:
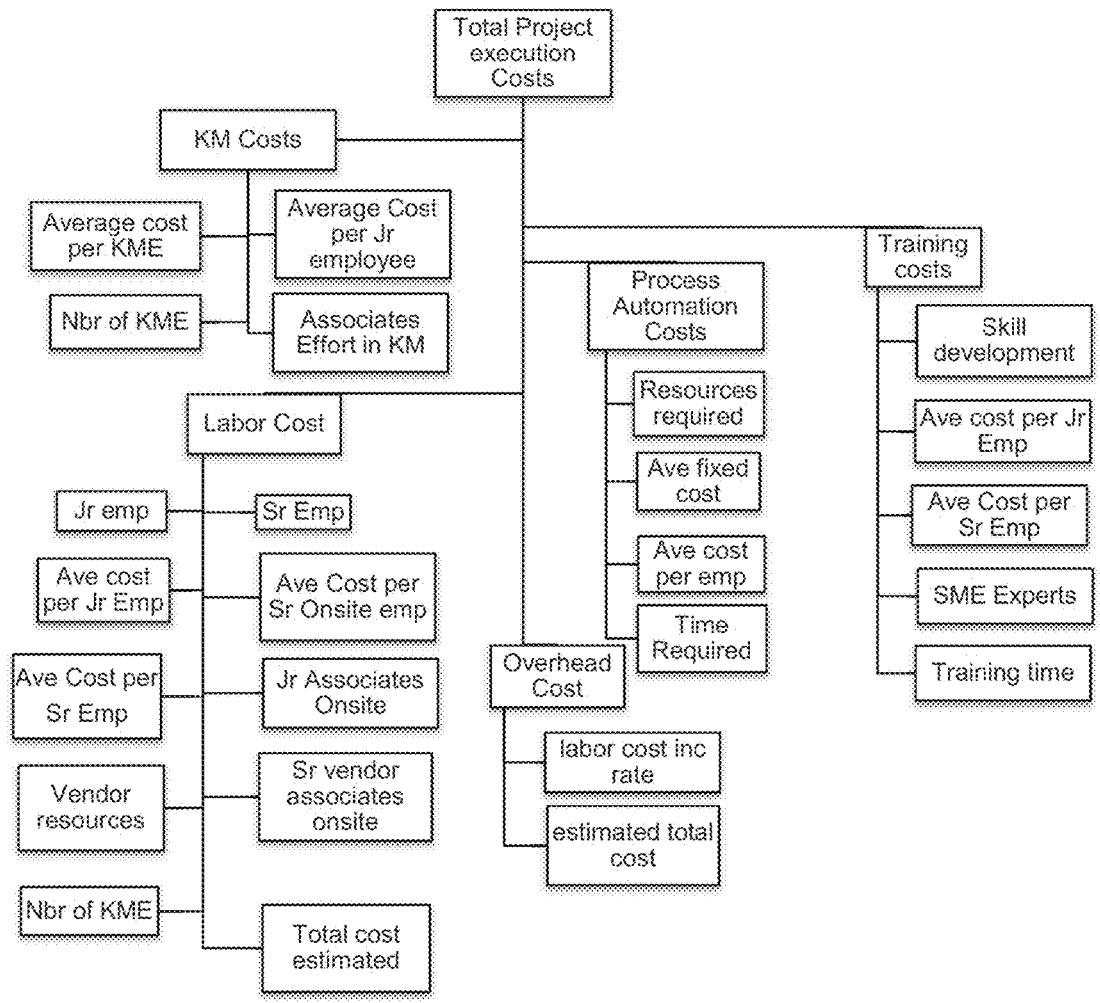
FIG. 4(a) illustrates a causal tree for total project execution costs, in accordance with an embodiment of the present subject matter.
Figure 4B:
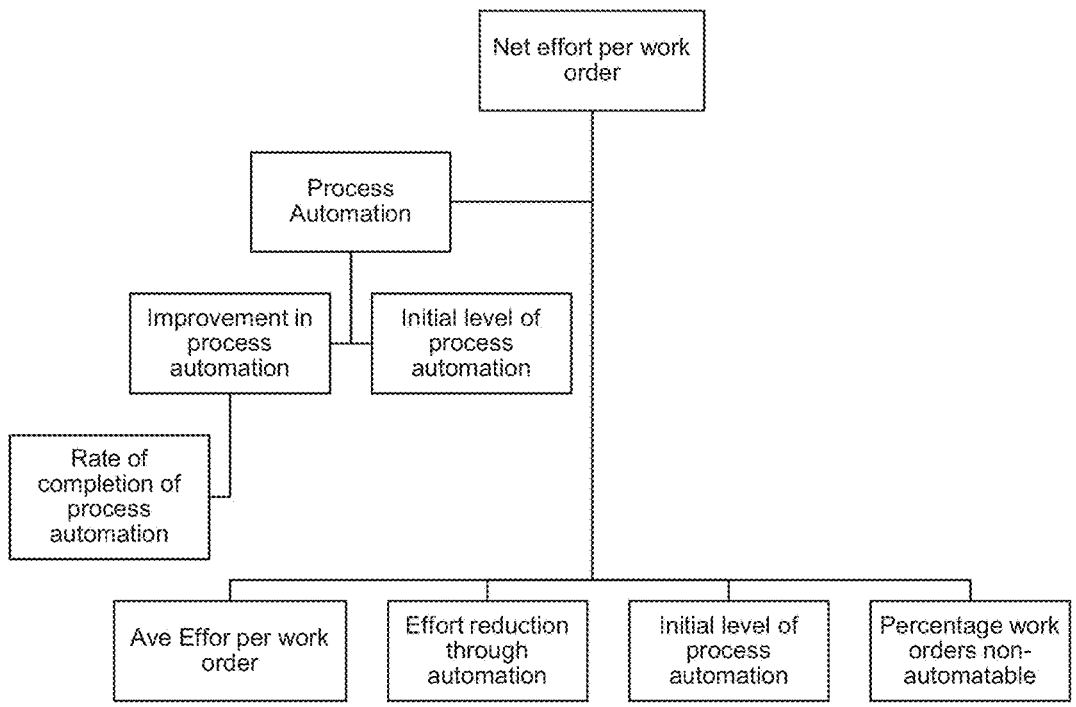
FIG. 4(b) illustrates a causal tree for net effort per work order, in accordance with an embodiment of the present subject matter.

FIG. 4 depicts an example of a causal tree below:

The following example has been used for ease of understanding of the functioning of the simulation module 120 and the analysis module 122. The causal tree for total project execution cost earlier discussed in FIG. 4(*a*) has been used for ease of understanding. In the example, improvement of the total project execution costs is considered to be an objective of the engagement. As shown in FIG. 4(*a*), the total project execution costs is affected by knowledge management (KM) costs, labor costs, overhead costs, process automation costs, and training costs. Based on the causal tree, it may be back traced that 'process automation costs' affects the total project execution costs. Further, although the causal trees for the parameter of improving productivity have not been shown for reasons of brevity, a person skilled in the art of dealing with outsourcing engagements may be aware that an improvement in costs can be achieved by reducing effort required per work order.

FIG. 4(*b*) shows the causal tree for net effort per work order. Tracing back from net effort per work order in the causal tree represented in FIG. 4(*b*), it may be seen that improvement in process automation affects the parameter net effort per work order. The system dynamics model may provide the relationship between the improvement in process automation and net effort per work order. In this example, it may be considered that an improvement in process automation reduces the net effort per work order, which in turn reduces total project execution costs. Further, although the causal tree for net effort per work order has not been shown for purposes of brevity, it may be understood that net effort per week may also be affected by knowledge management and more specifically the parameter improvement in competency through training. The system dynamics model may be used to understand the relationship between improvement in competency through training and net effort per work order. It may be also understood that an improvement in competency through training reduces the net effort per work order, and therefore the total project execution costs.

Based on the causal analysis of total project execution costs, the control variables that may be determined to affect the target may include, but not limited to improvement in process automation, improvement in competency through training, and number of knowledge management experts.

Figure 5B:
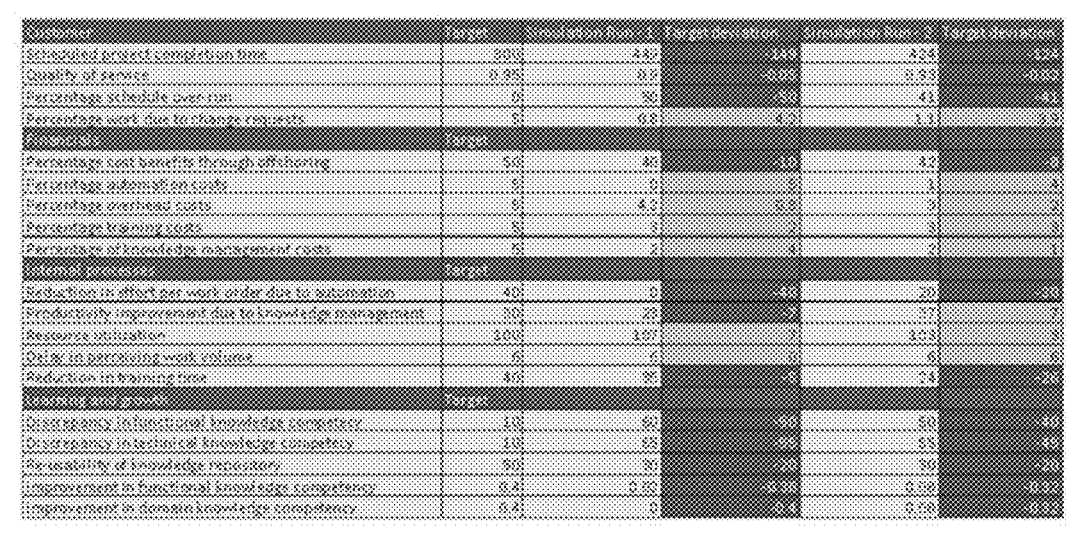
Figure 5C:
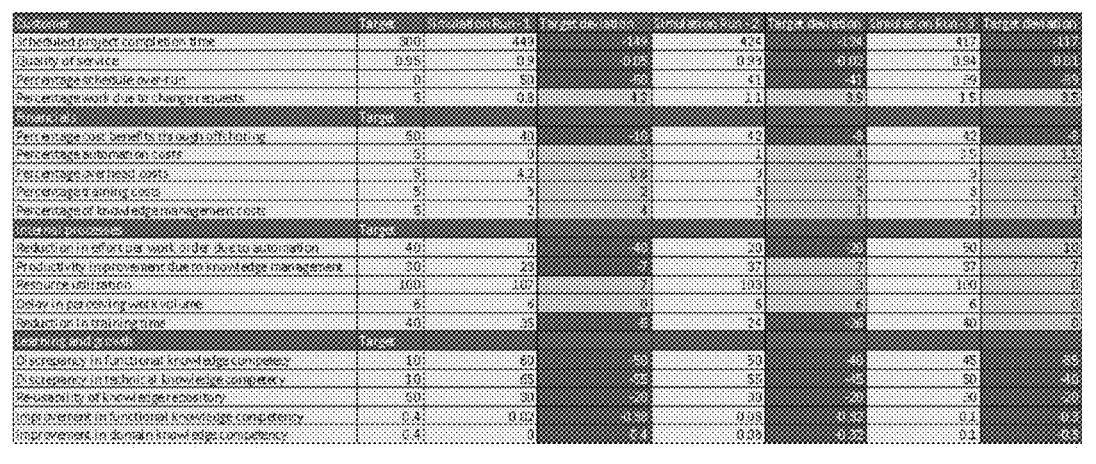

FIG. 5(*a*) shows the first simulation run based on values that are initialized. In one implementation, the simulation module 120 displays the benchmark values and also displays the simulated values arrived at by the simulation run and the target deviation. It may be observed in the results of simulation run-1 and benchmark deviation, that the simulated value for schedule project completion time is deviated from the benchmark value for the same. Also reduction in effort per work order due to automation is deviated from the benchmark value. The same can be observed of the other parameters shown in the FIG. 5(*a*).

The control variables determined earlier may be altered as shown below to study the impact of the change in control variable.
  (a) Improvement in process automation—increase by 20% of the given value
  (b) Improvement in competency through training—increase by 30% of the current value
  (c) Number of knowledge management experts—set at a value of 6

The simulation run-2 is run based on the changed control variables for a time period beginning from t=100 time units to t=200 time units. The simulated values according to simulation run-2 are shown in FIG. 5(*b*) below.

In one implementation of the present subject matter, the simulated values of simulation run-2 results are displayed alongside the simulation run-1 and the benchmark values of the parameters to measure target deviation and also the impact of altering the values of the determined control variables.

The control variables applied for simulation run-3 are given below. For the sake of brevity the parameters used for causal analysis and the causal analysis have not been discussed. Samples of causal analysis have been shown above. The causal analysis may be performed on several parameters to arrive at potential control variables. For simulation run-3, the control variables are altered as described below, and the simulation run-3 is performed from time t=200 time units to t=300 time units.
  a) Improvement in process automation—30% increase of the current value
  b) Improvement in competency through training—30% increase over the current value
  c) Desired senior to junior employees ratio—decrease from 0.167 to 0.125
  d) On-site to off-site employees ratio—reduction from 0.2 to 0.1
  e) Frequency of knowledge management sessions—increase from 2 to 4
  f) Number of subject matter experts in team—increase from 1 to 3
  g) Resource bench evaluation interval—reduction from 10 days to 5 days
  h) Resource hiring interval—reduction from 15 days to 5 days FIG. 5(*c*) shows the simulated values generated according to simulation run-3 is shown alongside simulated values of simulation run-1 and simulation run-2 and also alongside benchmark values set for the parameters.

It may be observed from the FIG. 5(*b*), that a reduction in schedule over-run is observed. Also it may be observed that cost savings by containing schedule over runs are offset because of increased cost of training and increased costs towards project automation.

The example explained herein also depicts that the benchmark value for scheduled project completion time was set at 300. It may be observed that in spite of the simulation run-3 with the altered control variables, the simulated values indicate that the benchmark value could not be achieved. This may prompt a decision maker to reduce the benchmark values for schedule project completion time and re-run the simulation to achieve an optimized target set. The decision maker may be the domain administrator or a user of the system.

It may be observed from the example above that the simulation module 120 performs simulation interactively, proactively and dynamically for achieving optimized execution management. It may also be observed that the objectives of the engagements are strategized by use of simulations and control variables. Further, the simulation module 120 may be invoked repeatedly with altered control variables or targets to indicate the possibility of achieving a target.

The analysis module 122 provides the user with various views. A view may be understood as a collection of perspectives, where each perspective is a collection of parameters organized in the schema. A view may be a user defined view, or may be a pre-defined view selected from a repository of views.

The analysis module 122 also provides an analysis of balanced scorecard perspective for the governance of an engagement. The balance score card is a structured reporting that allows governance of engagements in four perspectives of the engagement, namely,
  (a) customer,
  (b) financials,
  (c) learning and growth, and
  (d) internal processes The balanced scorecard is a collection of references to parameters in the schema. The analysis module 122 allows setting of targets selectively for parameters. Each element in the scorecard may be defined as one or more of Objectives, Critical success factor, control variables and parameters. FIG. 6 shows a perspective view generated by the analysis module 122.

The report generation module 124 is adapted to generate reports and dashboards. The report generation module 124 may be executed at any time during the lifecycle of the engagement. In one implementation, the report structures are predefined and stored in a repository. In another implementation, the report may be defined by the domain administrator. In one implementation, the attributes of the report or the elements shown in the report may be represented using different graphs for ease of comprehension. In another implementation, the report generation module 116 generates reports which may be color coded to indicate to the user or domain administrator of a deviation from expectation. In one implementation, the report generation module 124 allows for the data to be exported into a machine storable format and stored.

FIG. 2 illustrates a method 200 for governing a service provisioning engagement, according to an embodiment of the present subject matter. The order in which method 200 is described is not intended to be construed as a limitation, and any number of described method blocks can be combined in any order to implement the method 200, or any alternative methods. Additionally, individual blocks may be deleted from the method without departing from the spirit and scope of the subject matter described herein. Furthermore, the method can be implemented in any suitable hardware, software, firmware, or combination thereof.

A person skilled in the art will readily recognize that steps of the method can be performed by programmed computers. Herein, some embodiments are also intended to cover program storage devices, for example, digital data storage media, which are machine or computer readable and encode machine-executable or computer-executable programs of instructions, where said instructions perform some or all of the steps of the described method. The program storage devices may be, for example, digital memories, magnetic storage media such as a magnetic disks and magnetic tapes, hard drives, or optically readable digital data storage media. The embodiments are also intended to cover both communication network and communication devices configured to perform said steps of the exemplary methods.

Referring to FIG. 2, at block 202, a customized schema is determined based on the viable systems model. The customized schema is a set of dimensions and sub-dimensions, each of which are defined using one or more parameters or sub-dimensions, where the customized schema represents the governance structure of an engagement in a service provisioning model. The viable systems model can be customized to represent multiple service provisioning models. The schema that is instantiated for an engagement may be changed dynamically during the lifecycle of an engagement to represent various service provisioning models that are adapted during the lifecycle of the engagement. In one implementation a repository of dimensions, sub-dimensions and parameters is available for the domain administrator to choose from. In another implementation, the domain administrator may define a parameter, and corresponding update the relationship of the domain administrator defined parameter with one or more dimensions and sub-dimensions. Correspondingly, the system dynamics model may also need to be updated with rules pertaining to the newly defined parameter.

At block 204, a system dynamics model is determined which defines the relationship between the various parameters used to define the customized schema. The system dynamics model may be understood as a set of rules defining the interrelation between different parameters that are a part of the system dynamics model. The method at block 204 may include selection of a system dynamics model from a repository, where the inputs towards the selection may be provided by the domain administrator. It may be noted that the system dynamics model may be updated dynamically. In case the service provisioning model adopted in the engagement has changed over time, then correspondingly, the system dynamics model may be dynamically updated to capture the dynamics and the interrelationships between parameters.

At block 206, a benchmark value is set for one or more parameters from schema, where the benchmark value is indicative of desirable outcomes for the one or more parameters. In one implementation, the benchmark values may be altered depending upon the requirement of the specific engagement.

At block 208, the one or more parameters may be simulated, based on user inputs and system dynamic model. In one implementation the simulated values and benchmark values of similar parameters may be compared. In case of a target deviation, or in case of further analysis being required for some parameters, causal analysis may be performed for each parameter to arrive at control variables, where control variables represent parameters, where varying the values of the control variables may have an impact on the outcome. In another implementation, the analysis of the parameters may be used to suitably strategize the engagement by altering values of the control variables or the benchmark values of parameters or both. The simulation can be re-run for a predefined time to analyze the impact of the altered control variables, or the effect of the changed benchmark values of parameters.

Although the disclosed subject matter has been described with reference to particular modules, and embodiments, the disclosed subject matter is not intended to be limited to the particulars disclosed; rather, the subject matter extends to all functionally equivalent modules, systems, methods, and uses, such as are within the scope of the appended claims.

We claim:

1. A method for governing execution of a service provisioning engagement, the method being implemented by a governance system on a server having a processor, wherein the method comprises:

determining, by the processor, a customized schema based on a viable system model, wherein the customized schema is defined using a hierarchy of a plurality of dimensions and a plurality of sub-dimensions of each dimension, and wherein the plurality of dimensions and the plurality of sub-dimensions are determined based on a plurality of parameters, wherein the customized schema represents a governance structure of the service provisioning engagement, wherein the governance structure governs the execution of the service provisioning engagement throughout the life cycle of the service provisioning engagement and the governance structure evolves as the service provisional engagement evolves from one service provisioning model to another service provisioning model, wherein the governance structure is dynamically updated to capture aspects of the service provisioning engagement based on the evolved service provisioning model;

associating, by the processor, a system dynamics model with the customized schema, wherein the system dynamics model includes rules corresponding to dynamics of the plurality of parameters and interdependencies of the plurality of parameters and identifies relationships between the plurality of parameters of the customized schema, wherein the system dynamics model is dynamically updated upon ascertaining change in the service provisioning engagement, wherein the dynamics of the plurality of parameters refers to behavior of a parameter in an environment, impact of a parameter on other parameters in the environment, and influence of other parameters on a particular parameter;

setting, by the processor, a benchmark value for at least one parameter from amongst the plurality of parameters, wherein the benchmark value indicates a desirable outcome of the at least one parameter;

simulating, by the processor, the at least one parameter interactively, proactively, and dynamically based on the system dynamics model to generate a simulated value for the at least one parameter;

comparing, by the processor, the simulated value with the benchmark value for the at least one parameter for governance of execution of the service provisioning engagement; and performing, by the processor, a causal analysis on the at least one parameter to ascertain cause for the deviation of the at least one parameter from the benchmark value, wherein the causal analysis results in identifying one or more control variables to alter the simulated value, wherein the deviation is analyzed for strategic change with respect to altering the benchmark value, wherein the simulation is re-run for a predefined time to analyze the impact of altering the one or more control variables or the effect of the altering of the benchmark value for the at least one parameter, wherein the simulation facilitates identifying areas of concerns, revising expectations of an engagement and taking corrective action when the simulated values are deviated from the benchmark values.

2. The method as claimed in claim 1, wherein the plurality of dimensions include at least one of a service delivery, co-ordination and communication, monitor and control, planning and intelligence, and strategic policies.

3. The method as claimed in claim 1, wherein the method further comprises defining objectives as a combination of the plurality of parameters.

4. The method as claimed in claim 3, wherein the method further comprises determining deviation between the benchmark value and the simulated value for the at least one parameter to measure adherence to the objectives.

5. The method as claimed in claim 1, wherein the causal analysis is utilized to alter outcome of the at least one parameter.

6. The method as claimed in claim 1, wherein the method further comprises monitoring the simulated values of the at least one parameter through a balanced score card approach, wherein the balanced score card approach includes the at least one parameter in at least one perspective.

7. The method as claimed in claim 6, wherein the at least one perspective includes at least one of a customer, financials, internal process, and learning and growth process.

8. The method as claimed in claim 1, wherein the method further comprises defining objectives, the one or more control variables, critical success factors (CSFs), wherein the CSFs affect the execution of the engagement, wherein the one or more control variables are identified based on a similarity of the objectives, or dimension of the customized schema.

9. A governance system for governing a service provisioning engagement, the governance system comprising:
a processor;
a schema customization module coupled to the processor to determine a customized schema based on a viable system model, wherein the customized schema is defined using a hierarchy of a plurality of dimensions and a plurality of sub-dimensions of each dimension, and wherein the plurality of dimensions and the plurality of sub-dimensions is defined using a plurality of parameters, wherein the customized schema represents a governance structure of the service provisioning engagement, wherein the governance structure governs the execution of the service provisioning engagement throughout the life cycle of the service provisioning engagement and the governance structure evolves as the service provisional engagement evolves from one service provisioning model to another service provisioning model, wherein the governance structure is dynamically updated to capture aspects of the service provisioning engagement based on the evolved service provisioning model;
a target setting module coupled to the processor to set a benchmark value for at least one parameter from amongst the plurality of parameters, wherein the benchmark value indicates a desirable outcome of the at least one parameter; and
a simulation module coupled to the processor to:
define a system dynamics model, wherein the system dynamics model defines rules corresponding to dynamics of the plurality of parameters and interdependencies of the plurality of parameters and identify relationships between the plurality of parameters of the customized schema, wherein the system dynamics model is dynamically updated upon ascertaining change in the service provisioning engagement, wherein the dynamics of the plurality of parameters refers to behavior of a parameter in an environment, impact of a parameter on other parameters in the environment, and influence of other parameters on a particular parameter;
simulate the at least one parameter interactively, proactively, and dynamically based on the system dynamics model to generate simulated values for the at least one parameter, wherein the simulating allows governance of the service provisioning engagement based on comparison with the benchmark values; and
perform a causal analysis on the at least one parameter to ascertain cause for the deviation of the at least one parameter from the benchmark value, wherein the causal analysis results in identifying one or more control variables to alter the simulated value, wherein the deviation is analyzed for strategic change with respect to altering the benchmark value, wherein the simulation is re-run for a predefined time to analyze the impact of altering the one or more control variables or the effect of the altering of the benchmark value for the at least one parameter, wherein the simulation facilitates identifying areas of concerns, revising expectations of an engagement and taking corrective action when the simulated values are deviated from the benchmark values.

10. The governance system as claimed in claim 9, wherein the governance system further comprises an analysis module to define objectives as a combination of the plurality of parameters.

11. The governance system as claimed in claim 10, wherein the analysis module further determines a deviation between the benchmark value and the simulated values, and wherein the deviation is a measure of adherence to the objectives.

12. The governance system as claimed in claim 10, wherein the causal analysis is utilized to alter outcome of the at least one parameter.

13. The governance system as claimed in claim 9, wherein the governance system further comprises a report generation module to monitor the simulated values of the at least one parameter through a view, wherein the view includes the at least one parameter in at least one perspective.

14. A non-transitory computer readable medium having a set of computer readable instructions that, when executed, cause a server to:
determine a customized schema based on a viable system model, wherein the customized schema is defined using a hierarchy of a plurality of dimensions and a plurality of sub-dimensions of each dimension, and wherein the plurality of dimensions and the plurality of sub-dimensions is defined using a plurality of parameters, wherein the customized schema represents a governance structure of the service provisioning engagement, wherein the governance structure governs the execution of the service provisioning engagement throughout the life cycle of the service provisioning engagement and the governance structure evolves as the service provisional engagement evolves from one service provisioning model to another service provisioning model, wherein the governance structure is dynamically updated to capture aspects of the service provisioning engagement based on the evolved service provisioning model;

define a system dynamics model, wherein the system dynamics model defines rules corresponding to dynamics of the plurality of parameters and interdependencies of the plurality of parameters and identify relationships between the plurality of parameters of the customized schema, wherein the system dynamics model is dynamically updated upon ascertaining change in the service provisioning engagement, wherein the dynamics of the plurality of parameters refers to behavior of a parameter in an environment, impact of a parameter on other parameters in the environment, and influence of other parameters on a particular parameter;

set a benchmark value for at least one parameter from amongst the plurality of parameters, wherein the benchmark value indicates a desirable outcome of the at least one parameter;

simulate the at least one parameter interactively, proactively, and dynamically based on the system dynamics model to generate simulated values for the at least one parameter, wherein the simulating allows governance of the service provisioning engagement based on comparison with the benchmark values; and perform a causal analysis on the at least one parameter to ascertain cause for the deviation of the at least one parameter from the benchmark value, wherein the causal analysis results in identifying one or more control variables to alter the simulated value, wherein the deviation is analyzed for strategic change with respect to altering the benchmark value, wherein the simulation is re-run for a predefined time to analyze the impact of altering the one or more control variables or the effect of the altering of the benchmark value for the at least one parameter, wherein the simulation facilitates identifying areas of concerns, revising expectations of an engagement and taking corrective action when the simulated values are deviated from the benchmark values.

15. The method as claimed in claim 1, wherein the service provisioning engagement uses managed services as the service provisioning model and the managed services involve knowledge management as the dimension that is defined in the customized schema based on the viable system model and the system dynamics model includes rules for parameters related to the knowledge management, wherein the service provisioning engagement is modeled based on the managed services.

16. The governance system as claimed in claim 9, wherein the service provisioning engagement uses managed services as the service provisioning model and the managed services involve knowledge management as the dimension that is defined in the customized schema based on the viable system model and the system dynamics model includes rules for parameters related to the knowledge management, wherein the service provisioning engagement is modeled based on the managed services.

\* \* \* \* \*